United States Patent
Park (10) Patent No.: US 7,885,127 B2
(45) Date of Patent: Feb. 8, 2011

(54) SEMICONDUCTOR MEMORY DEVICE AND OPERATION METHOD THEREOF

(75) Inventor: Mun Phil Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 113 days.

(21) Appl. No.: 12/327,404

(22) Filed: Dec. 3, 2008

(65) Prior Publication Data
US 2009/0303808 A1 Dec. 10, 2009

(30) Foreign Application Priority Data
Jun. 4, 2008 (KR) .......................... 2008-0052776

(51) Int. Cl.
*G11C 7/00* (2006.01)
(52) U.S. Cl. ................ 365/193; 365/210.11; 365/233.1
(58) Field of Classification Search ................ 336/193, 336/194, 205, 230.06; 365/233.1, 210.11
See application file for complete search history.

(56) References Cited

U.S. PATENT DOCUMENTS

| | | |
|---|---|---|
| 6,950,370 B2 | 9/2005 | Lee |
| 7,068,549 B2 | 6/2006 | Cho |
| 7,143,258 B2 | 11/2006 | Bae |
| 7,224,625 B2 | 5/2007 | Dietrich et al. |
| 7,577,057 B2 * | 8/2009 | Lee et al. .................. 365/233.1 |
| 7,633,324 B2 * | 12/2009 | Yun et al. .................... 327/160 |
| 7,652,932 B2 * | 1/2010 | Millar et al. ........... 365/189.07 |
| 2009/0091350 A1 * | 4/2009 | Blodgett et al. ............... 326/30 |
| 2009/0316502 A1 * | 12/2009 | Lee ............................. 365/193 |

FOREIGN PATENT DOCUMENTS

| | | |
|---|---|---|
| JP | 11-328963 | 11/1999 |
| KR | 1020040060168 | 7/2004 |
| KR | 1020070056446 A | 6/2007 |
| KR | 1020070119378 | 12/2007 |
| KR | 1020080037931 A | 5/2008 |

OTHER PUBLICATIONS

Notice of Preliminary Rejection issued from Korean Intellectual Property Office on Oct. 30, 2009.
Notice of Allowance issued from Korean Intellectual Property Office on Jun. 3, 2010.

* cited by examiner

Primary Examiner—Gene N. Auduong
(74) Attorney, Agent, or Firm—IP & T Group LLP (57) ABSTRACT

A semiconductor memory device includes a reference strobe signal generator configured to generate a reference strobe signal having a reference pulse width in response to a bank information signal and a column command signal, and a main strobe signal generator configured to generate a main strobe signal by controlling the reference pulse width in response to the reference strobe signal and a bank grouping signal that is activated in a bank grouping mode where columns are continuously accessed in a plurality of logically grouped banks.

20 Claims, 5 Drawing Sheets

| BANK | ADDRESS | | | | 512M | 1G | 2G |
|---|---|---|---|---|---|---|---|
| | BA3 | BA2 | BA1 | BA0 | 8 BANK | 16 BANK | 16 BANK |
| 0 | 0 | 0 | 0 | 0 | 1ST BANK GROUP | 1ST BANK GROUP | 1ST BANK GROUP |
| 1 | 0 | 0 | 0 | 1 | | | |
| 2 | 0 | 0 | 1 | 0 | 2ND BANK GROUP | | |
| 3 | 0 | 0 | 1 | 1 | | | |
| 4 | 0 | 1 | 0 | 0 | 3RD BANK GROUP | 2ND BANK GROUP | 2ND BANK GROUP |
| 5 | 0 | 1 | 0 | 1 | | | |
| 6 | 0 | 1 | 1 | 0 | 4TH BANK GROUP | | |
| 7 | 0 | 1 | 1 | 1 | | | |
| 8 | 1 | 0 | 0 | 0 | | 3RD BANK GROUP | 3RD BANK GROUP |
| 9 | 1 | 0 | 0 | 1 | | | |
| 10 | 1 | 0 | 1 | 0 | | | |
| 11 | 1 | 0 | 1 | 1 | | | |
| 12 | 1 | 1 | 0 | 0 | | 4TH BANK GROUP | 4TH BANK GROUP |
| 13 | 1 | 1 | 0 | 1 | | | |
| 14 | 1 | 1 | 1 | 0 | | | |
| 15 | 1 | 1 | 1 | 1 | | | |

SEMICONDUCTOR MEMORY DEVICE AND OPERATION METHOD THEREOF

CROSS-REFERENCE TO RELATED APPLICATIONS

This application claims priority to Korean patent application number 10-2008-0052776, filed on Jun. 4, 2008, which is incorporated by reference in its entirety.

BACKGROUND OF THE INVENTION

The present subject matter relates to a semiconductor design technology, and more particularly, to a semiconductor memory device for generating a main strobe signal as a source signal for columns and a driving method thereof.

In general, a semiconductor memory device such as a double data rate synchronous DRAM (DDR SDRAM) generates a main strobe signal in response to a column address strobe (CAS) which is a column command. The main strobe signal is a pulse signal having a pulse width corresponding to an external clock signal. Such a main strobe signal is used as a source signal for generating main signals for columns. The main strobe signal is mainly used to generate a column selection signal, a write driver enable signal, and an input/output sense amplifying enable signal. Here, the column selection signal, the write driver enable signal, and the input/output sense amplifying enable signal have a pulse width corresponding to the main strobe signal.

Figure 1:
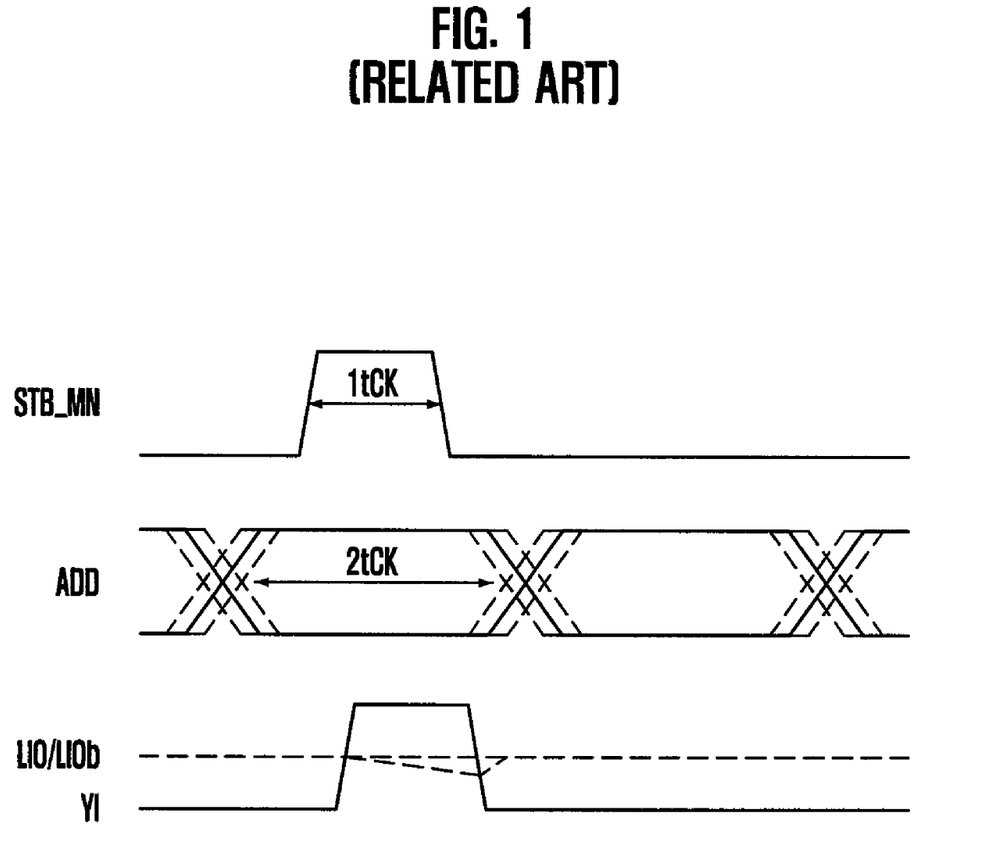
FIG. 1 illustrates an operation waveform of a semiconductor memory device according to the related art.

FIG. 1 illustrates an operation waveform of a semiconductor memory device according to the related art. FIG. 1 shows a main strobe signal STB_MN, an address information ADD, main/sub local input/output lines LIO and LIOb, and a column selection signal YI.

Referring to FIG. 1, the main strobe signal STB_MN is activated in response to a column command (not shown), and the column selection signal YI is generated based on the main strobe signal STB_MN. Data corresponding to the address information ADD is applied to the main/sub local input/output lines LIO and LIOb in response to the column selection signal YI. The main local input/output line LIO and the sub local input/output line LIOb sustain a precharge voltage before the column selection signal YI is activated. If the column selection signal YI is activated, a voltage level difference is generated according to applied data. If the column selection signal YI is inactivated, the main local input/output line LIO and the sub local input/output line LIOb sustain the precharge voltage again.

It is assumed that CAS to CAS Delay (tCCD) is equivalent to 2tCK for convenience where tCCD is a minimum time for accessing another column after accessing one column in the same bank. It means that the address information ADD is toggled once at 2tCK. In consideration of the precharging time of the main/sub local input/output lines LIO and LIOb, it is obvious that the column selection signal YI has a pulse width of 1tCK. That is, the main strobe signal STB_MN has the pulse width of 1tCK. Since a skew may be generated at the address information ADD, a window of the address information ADD is not substantially equivalent to 2tCK. Therefore, an operation margin of the address information ADD and the main strobe signal STB_MN is very small.

As a result, next data information ADD is unintentionally reflected although the voltage level difference is not generated in the main/sub local input/output lines LIO and LIOb due to the data. Therefore, it makes reading data difficult. Accordingly, the write driver enable signal and the input/output sense amplifying enable signal which are generated based on the main strobe signal STB_MN also have the operation margin problem.

Since one cycle of an external clock signal applied to a semiconductor memory device is shortened up to 1 nano second (ns) lately, a pulse width of the main strobe signal STB_MN is 500 pico second (ps) to 1 nano second (ns). Accordingly, a pulse width of the column selection signal YI generated corresponding to the main strobe signal STB_MN also becomes shortened. It cannot guarantee enough time for generating sufficient voltage level difference at the main/sub local input/output lines LIO and LIOb. The main strobe signal having a very small pulse width may be unable to make full swing to a destination because the main strobe signal STB_MN has very large loading. Therefore, the operation characteristic of a circuit may be deteriorated. In the worst case, an operation error is caused because the main strobe signal STB_MN disappears.

SUMMARY OF THE INVENTION

Embodiments of the present subject matter are directed to providing a semiconductor memory device for securing an operation margin of a signal generated based on a main strobe signal by controlling a pulse width of the main strobe signal.

In accordance with an aspect of the disclosure, there is provided a semiconductor memory device including: a reference strobe signal generator configured to generate a reference strobe signal having a reference pulse width in response to a bank information signal and a column command signal; and a main strobe signal generator configured to generate a main strobe signal by controlling the reference pulse width in response to the reference strobe signal and a bank grouping signal that is activated in a bank grouping mode where columns are continuously accessed in a plurality of logically grouped banks.

In accordance with another aspect of the disclosure, there is provided a method for driving a semiconductor memory device including: applying an address corresponding to a bank grouping mode where columns are continuously accessed among a plurality of logically grouped banks; generating a main strobe signal having a reference pulse width or an extended pulse width in response to the bank grouping mode; and reading data information corresponding to the address in response to the main strobe signal.

In accordance with another aspect of the disclosure, there is provided a semiconductor memory device including: a reference strobe signal generator configured to generate a reference strobe signal having a reference pulse width in response to a bank information signal and a column command signal; and a main strobe signal generator configured to output the main strobe signal which has the same pulse width as the reference strobe signal in a non-bank grouping mode and which has more extended pulse width than the reference strobe signal in a bank grouping mode.

As an operation speed of a semiconductor memory device increases lately, a cycle of an external clock signal is reduced. Therefore, a pulse width of a main strobe signal, which is generated based on one cycle of the external clock signal, is also reduced. Pulse widths of a column selection signal, a write driver enable signal, and an input/output sense amplifying enable signal, which are generated based on the main strobe signal, are reduced, too. The main strobe signal having the reduced pulse width may deteriorate circuit operation characteristic and cause operation error. Meanwhile, the operation margins of address information and the main strobe signal may be reduced. It may deteriorate accuracy and reliability of a semiconductor memory device. In the present subject matter, the pulse width of the main strobe signal is controlled to be longer than that of the related art in a bank grouping mode. Therefore, the operation characteristic can be improved and the operation error can be prevented. Also, the operation margins for the column selection signal, the write driver enable signal, and the input/output sense amplifying enable signal can be secured.

DESCRIPTION OF SPECIFIC EMBODIMENTS

Embodiments of the present subject matter relate to a semiconductor memory device for generating a main strobe signal as source for columns and a driving method thereof.

Other objects and advantages of the present subject matter can be understood by the following description, and become apparent with reference to the embodiments of the present subject matter.

Before describing embodiments of the present subject matter, a bank grouping mode, which is defined as a specification, will be described.

The bank grouping mode is a mode that extends Column Address Strobe (CAS) to CAS Delay (tCCD) when columns in the same bank are continuously accessed after a plurality of banks are logically grouped. It is defined as the specification in order to reduce a load of a semiconductor memory device that operates at a speed higher than a predetermined speed.

In other words, tCCD is fixed based on an external clock signal such as 2tCK in a normal mode, not in the bank grouping mode, regardless of a grouped bank. That is, tCCD becomes 2tCK when columns are sequentially accessed in differently grouped banks in the normal mode. Also, tCCD becomes 2tCK when columns are continuously accessed in a grouped bank in the normal mode. On the contrary, tCCD becomes 2tCK in the bank grouping mode if columns are consecutively accessed in differently grouped banks in the bank grouping mode. However, if columns are continuously accessed in a grouped bank, tCCD extends to 4tCK in the bank grouping mode.

Figure 2:
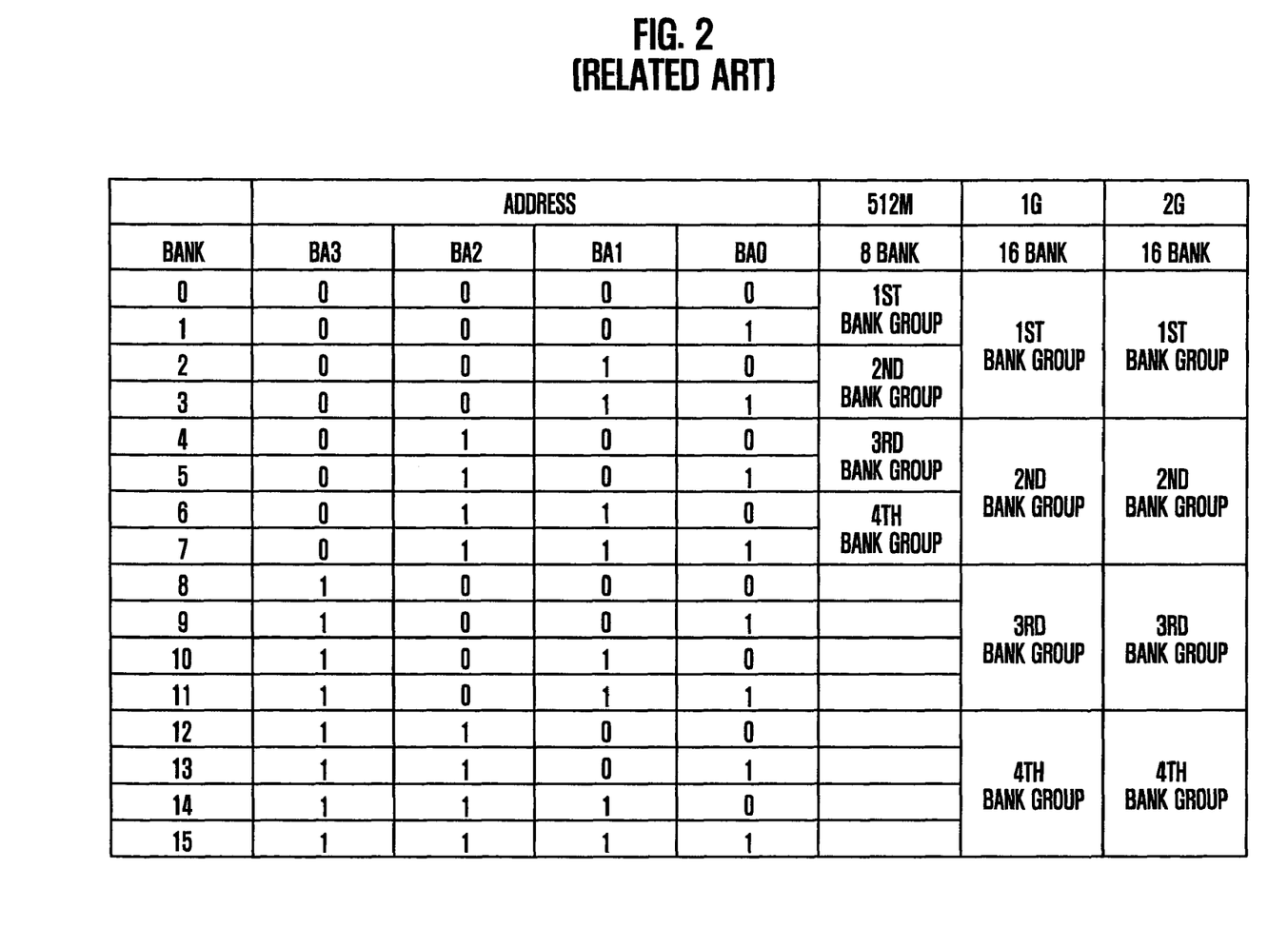
FIG. 2 is a table showing banks grouped in a bank grouping mode.

FIG. 2 is a table showing banks grouped in a bank grouping mode. The table shows bank addresses BA0, BA1, BA2, and BA3, and grouped bank states of a semiconductor memory device having a 512-mega 8-bank structure, a 1-giga 16-bank structure, and a 2-giga 16-bank structure.

Referring to FIG. 2, in case of the semiconductor memory device having the 512-mega 8-bank structure, a $0^{th}$ bank and a first bank are defined as a first bank group, a second bank and a third bank are defined as a second bank group, a fourth bank and a fifth bank are defined as a third bank group, and a sixth bank and a seventh bank are defined as a fourth bank group.

In case of the semiconductor memory device having the 1-giga 16-bank structure, a $0^{th}$ bank to a third bank are defined as a first bank group, a fourth bank to a seventh bank are defined as a second bank group, an eight bank to an eleventh bank are defined as a third bank group, and a twelfth bank to a fifteenth bank are defined as a fourth bank group.

In case of the semiconductor memory device having a 2-giga 16-bank structure, each of four consecutive banks are defined as a first bank group, a second bank group, a third bank group, and a fourth group bank like the semiconductor memory device having the 1-giga 16-bank structure.

For convenience, the embodiments of the present subject matter will be described based on a 1-giga semiconductor memory device.

For example, in case of a normal mode, if columns in the first bank group are accessed, columns in the first to fourth bank groups are accessed after 2tCK. In other words, 2tCK is required to access one bank in the first to fourth bank groups after accessing one bank in the first to fourth bank groups. That is, tCCD is always equivalent to 2tCK regardless of the grouped bank.

In case of a bank grouping mode, 4tCK is required to access columns in a first bank group after columns in the first group are accessed. Also, 2tCK is required to access columns in the second to fourth bank groups after accessing columns in the first bank group. That is, if columns are continuously accessed in grouped banks, tCCD becomes 4tCK. If columns are continuously accessed in differently grouped banks, tCCD becomes 2tCK.

Figure 3A:
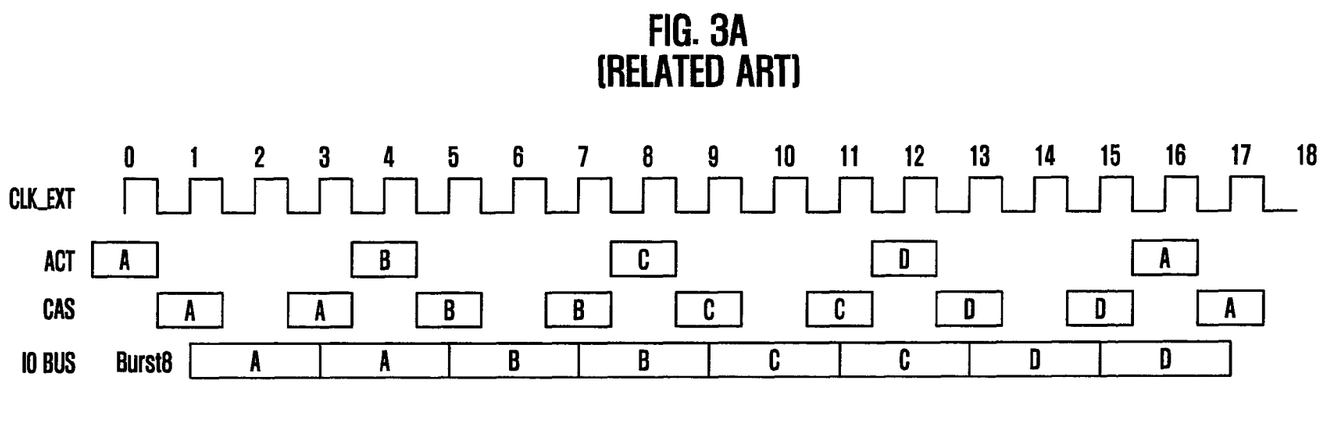
FIGS. 3A and 3B illustrate waveforms of a semiconductor memory device in accordance with an embodiment of the present subject matter.
Figure 3B:
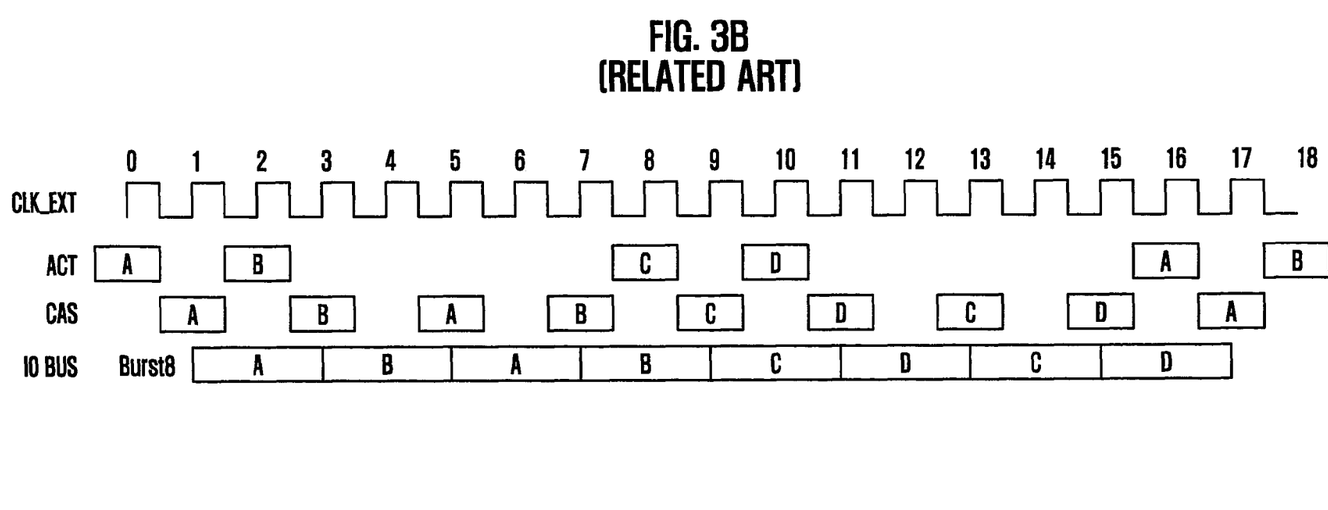

FIGS. 3A and 3B are waveforms showing a bank access order in a bank grouping mode according to the specification. FIG. 3A shows a waveform in a normal mode, and FIG. 3B shows a waveform in a bank grouping mode. In FIGS. 3A and 3B, A is a signal related to the first bank group of FIG. 2, B is a signal related to the second bank group, C is a signal related to the third bank group, and D is a signal related to the fourth bank group.

Referring to FIGS. 3A and 3B, in case of a typical semiconductor memory device, an active signal ACT is activated for activating a word line of a corresponding bank, and a column address strobe signal CAS is activated for accessing columns in a corresponding bank. Accordingly, data information is applied to an input/output bus (IO BUS).

In case of a normal mode in FIG. 3A, the column address strobe signal CAS is applied at 2tCK based on one cycle of an external clock signal CLK_EXT regardless of a grouped bank. That is, data information corresponding to the first bank group is applied to the input/output but (IO BUS) at an interval of 2tCK, and data information corresponding to the second to fourth bank groups are applied to the input/output bus (IO BUS) at an interval of 2tCK. In view of the IO BUS, data information is toggled at an interval of 2tCK.

However, in the case of a bank grouping mode of FIG. 3B, the column address strobe signal CAS is applied at an interval of 2tCK corresponding to the sequential column access of different grouped banks, and the column address strobe signal CAS is applied at an interval of 4tCK corresponding to the sequential column access in a grouped bank. That is, if data information corresponding to the first bank group is applied to the input/output bus (IO BUS), data information corresponding to the second to fourth bank groups can be applied after 2tCK, and data information corresponding to the same first bank group can be applied after 4tCK. Data information corresponding to the second to fourth bank groups is also applied based on the described rule.

Although data information is toggled at an interval of 4tCK in view of the column address strobe signal, data information is toggled at an interval of 2tCK in view of the input/output bus (IO BUS). This means that the bank grouping mode and the normal mode have the same input/output bus efficiency.

Figure 4:
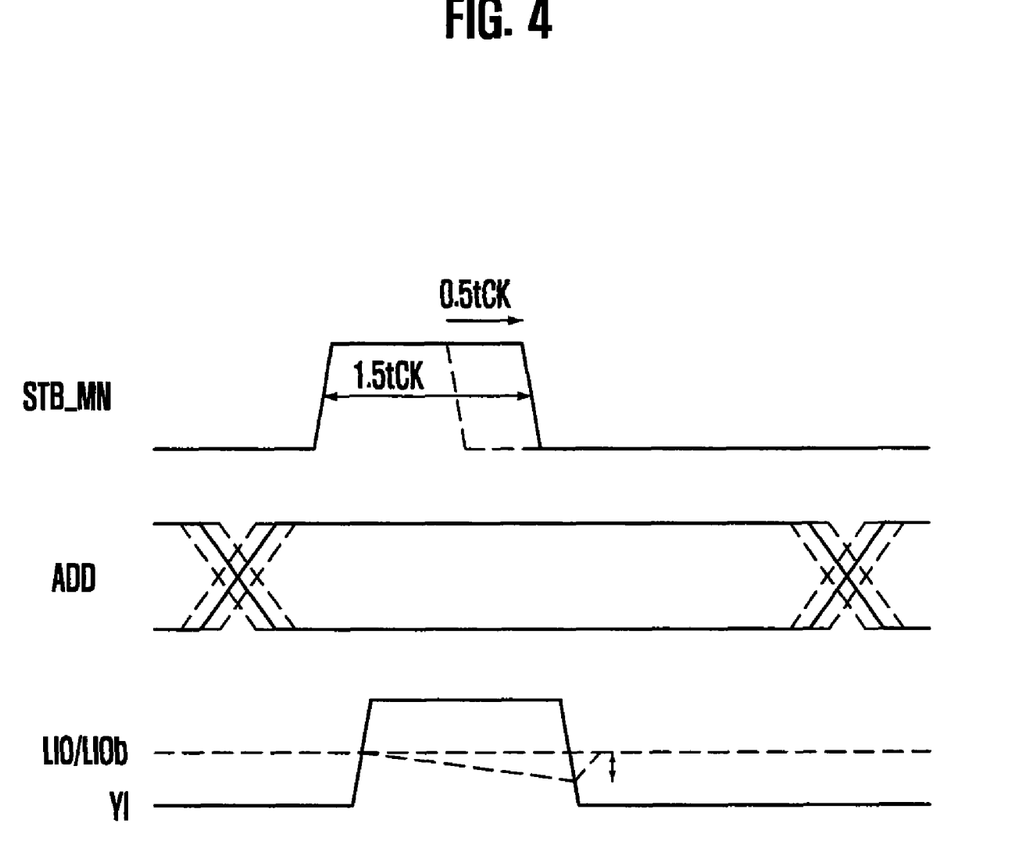
FIG. 4 illustrates waveforms of a semiconductor memory device in accordance with an embodiment of the present subject matter.

FIG. 4 illustrates a waveform of a semiconductor memory device in accordance with an embodiment of the present subject matter. FIG. 4 shows a main strobe signal STB_MN, an address information signal ADD, main/sub local input/output lines LIO and LIOb, and a column selection signal YI in a bank grouping mode. According to the present embodiment of the present subject matter, a window of the address information ADD can be extended to 4tCK and the main strobe signal STB_MN can be extended to be wider than a conventional pulse width because tCDD becomes 4tCK.

Referring to FIG. 4, if the main strobe signal STB_MN is activated according to a column command, a column selection signal YI is generated based on the main strobe signal STB_MN as a source, and data corresponding to the address information ADD is applied to the main/sub local input/output lines LIO and LIOb in response to the column selection signal YI. Here, the main local input/output line LIO and the sub local input/output line LIOb sustain a pre-charge voltage before the column selection signal YI is activated. If the column selection signal YI is activated, a voltage level difference is generated according to data corresponding to the address information ADD. If the column selection signal YI is inactivated, the main and sub local input/output lines sustain the pre-charge voltage again.

As shown in the drawings, a pulse width of the main strobe signal STB_MN is extended as much as about 0.5 tCK. Such an extended main strobe signal STB_MN can prevent operation error and improve the operation characteristic. Also, a pulse width of the column selection signal YI generated based on the main strobe signal STB_MN is extended. Therefore, it is possible to secure enough time for generating a sufficient voltage level difference at the main/sub location input/output lines LIO and LIOb. Although the main strobe signal STB_MN is extended, it is possible to guarantee a stable operation of the semiconductor memory device because of enough address information ADD and sufficient operation margin.

Figure 5:
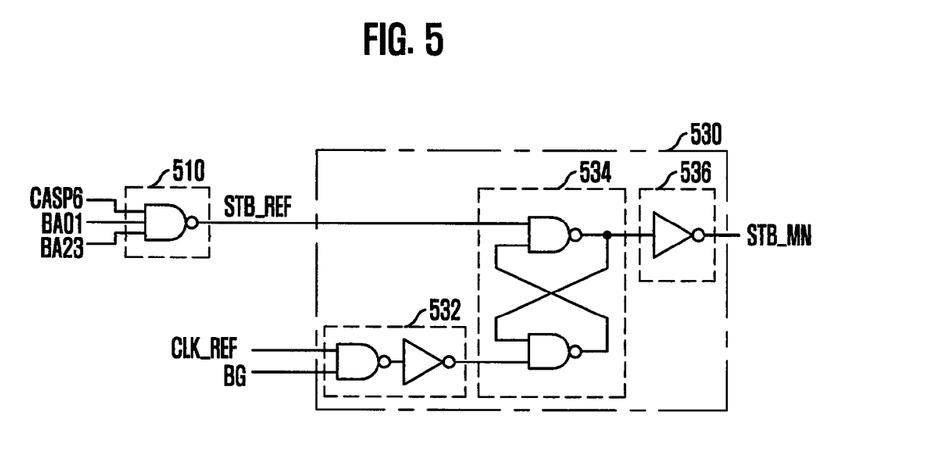
FIG. 5 is a circuit diagram showing a main strobe generation circuit in accordance with an embodiment of the present subject matter.

FIG. 5 is a circuit diagram illustrating a main strobe signal generation circuit in accordance with an embodiment of the present subject matter.

Referring to FIG. 5, the main strobe signal generation circuit includes a reference strobe signal generator 510 and a main strobe signal generator 530.

The reference strobe signal generator 510 may generate a signal CASP6 having a pulse width corresponding to one cycle 1tCK of an external clock signal in response to a column command and generate a reference strobe signal STB_REF having a reference pulse width 1tCK in response to bank information signals BA01 and BA23 which are obtained by pre-decoding bank addresses. Here, the bank information address BA01 is a signal obtained by pre-decoding addresses corresponding to the $0^{th}$ bank and the first bank, and the bank information address BA23 is a signal obtained by pre-decoding addresses corresponding to the second bank and the third bank. It is possible to select a predetermined bank using the bank information signals BA01 and BA23.

The main strobe signal generator 530 generates a main strobe signal STB_MN by controlling a reference pulse width 1tCK of the reference strobe signal STB_REF in response to a bank grouping signal BG which is activated in a bank grouping mode. For example, the main strobe signal STB_MN may have a reference pulse width (1tCK) or an extended pulse width (1.5tCK). Here, the main strobe signal generator 530 may include an input unit 532, a latch 534, and an output unit 536.

The input unit 532 receives a bank grouping signal BG and a reference clock signal CLK_REF and outputs a signal corresponding to the reference clock signal CLK_REF or a signal having a predetermined logical level. The input unit 532 can output a signal corresponding to the reference clock signal CLK_REF in response to the bank grouping signal BG which has a logical 'high' level in a bank grouping mode. Also, the input unit 532 can output a signal having a logical 'low' level in response to a bank grouping signal BG having a logical 'low' level in a normal mode. Here, the reference clock signal CLK_REF is a clock obtained by tuning the timing of an external clock signal through an internal delay circuit. Here, the bank grouping signal BG may be a signal provided at a mode register set.

The latch 534 receives a reference strobe signal STB_REF through a first input terminal and an output signal of the input unit 532 through a second input terminal and outputs a signal having a reference pulse width or an extended pulse width. The latch 534 outputs a signal corresponding to a reference strobe signal STB_REF in response to a bank grouping signal BG having a logical 'low' level. Also, the latch 534 outputs a signal having an extended pulse width in response to a bank grouping signal BG having a logical 'high' level.

The output unit 536 generates a main strobe signal STB_MN by reversing an output signal of the latch 534. The main strobe signal STB_MN corresponds to the output signal of the latch 534.

Figure 6:
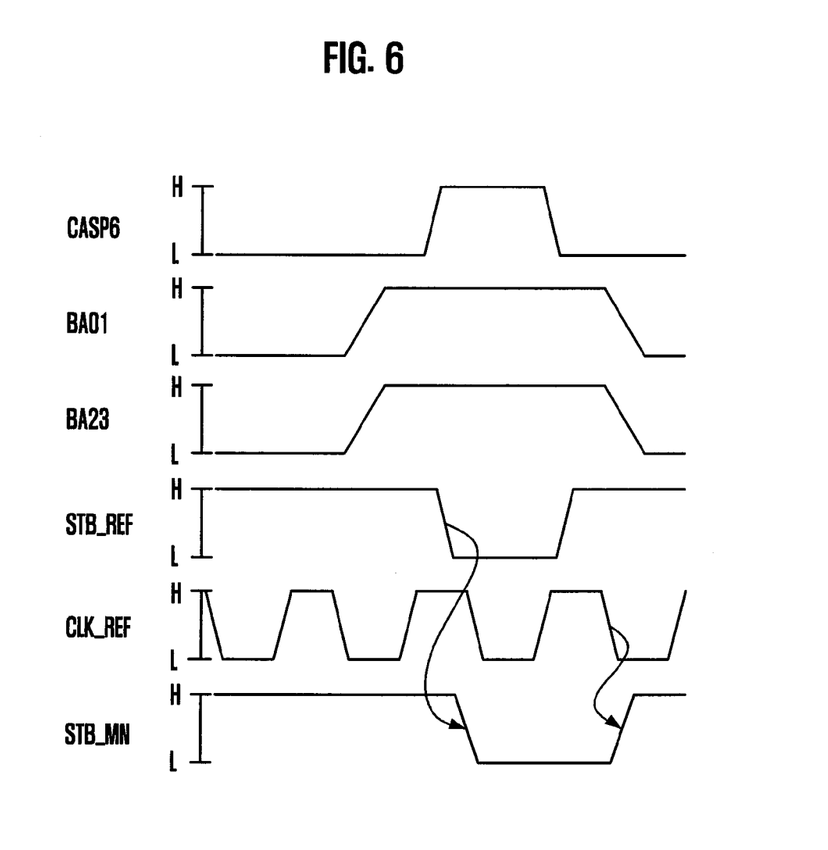
FIG. 6 illustrates a waveform showing an operation of a main strobe generation circuit of FIG. 5.

FIG. 6 is a waveform showing an operation of a main strobe signal generation circuit of FIG. 5. That is, FIG. 6 is a waveform in a bank grouping mode.

Referring to FIG. 6, if a corresponding bank is setup by the bank information signals BA01 and BA23 and a signal CASP6 having a logical 'high' pulse width is activated in response to a column address strobe signal, the reference strobe signal STB_REF is also activated as a logical 'low' level. The main strobe signal STB_MN transits to a logical 'low' level in response to the reference strobe signal STB_REF and transits to a logical 'high' level in response to a falling edge of the reference clock signal CLK_REF. In other words, the main strobe signal STB_MN is activated in response to the reference strobe signal STB_REF and inactivated in response to the reference clock signal CLK_REF. That is, the main strobe signal STB_MN may have a longer pulse width of 0.5 tCK than the reference strobe signal STB_REF. Although it is not shown in the drawings, the main strobe signal STB_MN is outputted in a normal mode in response to a reference strobe signal STB_REF having a reference pulse width. Finally, an activation period of the main strobe signal STB_MN in a bank grouping mode is longer than the activation period of the main strobe signal STB_MN in the normal mode.

According to the present embodiment, the reference clock signal CLK_REF of FIG. 5 is used to extend a pulse width of the main strobe signal STB_MN. However, the semiconductor memory device according to the present subject matter may include a delay circuit that delays a time of activating the reference strobe signal STB_REF in response to the bank grouping signal BG by a predetermined time and outputs the delayed reference strobe signal STB_REF as the main strobe signal STB_MN. It is not necessary to pay attention to the excessive extension of a pulse width if it is necessary to extend a pulse width of the main strobe signal STB_MN by a predetermined time in the same way that a pulse width of the main strobe signal STB_MN is extended based on the reference clock signal CLK_REF.

As described above, the main strobe signal STB_MN having an extended active period can be full-swung to a target destination, thereby improving overall operation characteristics and preventing a signal from disappearing. Also, activation periods of a column selection signal, a write driver enable signal, and input/output sense amplifying enable signal, which are generated based on the main strobe signal STB_MN having the extended activation period, can also be extended. Particularly, it is possible to secure an operation margin of data information in case of a column selection signal. It means that it is possible to secure a time for generating a sufficient voltage level difference at a main/sub local input/output lines LIO and LIOb. It is also possible to guarantee the optimal state for applying data information at main/sub local input/output lines.

Meanwhile, since it is obvious to those skilled in the art of the technical embodiment of a control signal generator for generating a column selection signal, a write driver enable signal, and input/output sense amplifying enable signal, the detailed descriptions thereof are omitted. Each of the circuits can generate a further stable column series control signal based on the main strobe signal STB_MN according to the present embodiment as a source and, it is, accordingly, possible to secure a stable operation margin of each control signal.

According to the present subject matter, a pulse width of a main strobe signal can be controlled according to the specification. Therefore, operation characteristics can be improved, and operation errors can be prevented. Accordingly, operation margins of a column selection signal, a write driver enable signal, and input/output sense amplifying enable signal can be secured.

Particularly, it is possible to guarantee the optimal state for applying data information at local input/output lines by securing the operation margin of the address information and the main strobe signal.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a reference strobe signal generator configured to generate a reference strobe signal having a reference pulse width in response to a bank information signal and a column command signal; and
    a main strobe signal generator configured to generate a main strobe signal by controlling the reference pulse width in response to the reference strobe signal and a bank grouping signal that is activated in a bank grouping mode where columns are continuously accessed in a plurality of logically grouped banks.

2. The semiconductor memory device of claim 1, wherein the main strobe signal has the reference pulse width or an extended pulse width.

3. The semiconductor memory device of claim 1, wherein the main strobe signal is activated in response to the reference strobe signal and inactivated in response to a reference clock signal.

4. The semiconductor memory device of claim 3, wherein the main strobe signal generator includes:
    an input unit configured to receive the bank grouping signal and the reference clock signal; and
    a latch having a first input terminal configured to receive the reference strobe signal and a second input terminal configured to receive an output signal of the input unit and outputting the main strobe signal.

5. The semiconductor memory device of claim 4, wherein the input unit outputs a signal corresponding to the reference clock signal or a signal having a predetermined logical level in response to the bank grouping signal.

6. The semiconductor memory device of claim 1, wherein the main strobe signal generator outputs the reference strobe signal as the main strobe signal in response to the bank grouping signal or delays the reference strobe signal by a predetermined time at the time of inactivation of the reference strobe signal and outputs the delayed signal as the main strobe signal.

7. The semiconductor memory device of claim 1, wherein the bank grouping signal is provided from a mode register set.

8. The semiconductor memory device of claim 1, further comprising a control signal generator configured to generate a control signal for controlling a circuit related to column access in response to the main strobe signal.

9. A method for driving a semiconductor memory device, comprising:
    applying an address corresponding to a bank grouping mode where columns are continuously accessed among a plurality of logically grouped banks;
    generating a main strobe signal having a reference pulse width or an extended pulse width in response to the bank grouping mode; and
    reading data information corresponding to the address in response to the main strobe signal.

10. The method of claim 9, wherein generating the main strobe signal includes:
    generating a reference strobe signal having the reference pulse width in response to a bank information signal and a column command signal; and
    outputting the main strobe signal having an extended reference pulse width in response to the bank grouping mode.

11. The method of claim 10, wherein the main strobe signal is activated in response to the reference strobe signal and inactivated in response to a reference clock signal.

12. The method of claim 10, wherein outputting the main strobe signal includes:
    outputting a signal corresponding to the reference pulse width in response to the bank grouping signal; and
    outputting a signal corresponding to an expanded pulse width in response to the bank grouping signal.

13. The method of claim 10, wherein the main strobe signal is inactivated after a predetermined time elapsed after an inactivating time of the reference strobe signal.

14. The method of claim 9, further comprising generating a control signal related to a column access operation in response to the main strobe signal.

15. A semiconductor memory device, comprising:
    a reference strobe signal generator configured to generate a reference strobe signal having a reference pulse width in response to a bank information signal and a column command signal; and
    a main strobe signal generator configured to output the main strobe signal which has the same pulse width as the reference strobe signal in a non-bank grouping mode and which has more extended pulse width than the reference strobe signal in a bank grouping mode.

16. The semiconductor memory device of claim 15, wherein the main strobe signal is activated in response to the reference strobe signal and inactivated in response to a reference clock signal.

17. The semiconductor memory device of claim 15, wherein the bank grouping mode and the non-bank grouping mode are determined by a bank grouping signal provided from a mode register set.

18. The semiconductor memory device of claim 17, wherein the main strobe signal generator includes:

an input unit configured to receive the bank grouping signal and the reference clock signal; and a latch having a first input terminal configured to receive the reference strobe signal and a second input terminal configured to receive an output signal of the input unit and outputting the main strobe signal.

19. The semiconductor memory device of claim 18, wherein the input unit outputs a signal corresponding to the reference clock signal or a signal having a predetermined logical level in response to the bank grouping signal.

20. The semiconductor memory device of claim 15, further comprising a control signal generator configured to generate a control signal for controlling a circuit related to column access in response to the main strobe signal.

* * * * *